United States Patent [19]
Hacskaylo

[11] 3,946,416
[45] Mar. 23, 1976

[54] LOW IMPEDANCE DIODE MOUNTING STRUCTURE AND HOUSING

[75] Inventor: Michael Hacskaylo, Falls Church, Va.

[73] Assignee: The United States of America as represented by the Secretary of the Army, Washington, D.C.

[22] Filed: June 4, 1974

[21] Appl. No.: 476,249

Related U.S. Application Data

[63] Continuation of Ser. No. 354,067, April 24, 1973, abandoned.

[52] U.S. Cl. .............. 357/17; 357/65; 357/74; 357/72; 357/75; 357/81
[51] Int. Cl.² H01L 33/00; H01L 23/48; H01L 23/02; H01L 23/12
[58] Field of Search ............ 357/74, 72, 75, 81, 17, 357/65

[56] References Cited
UNITED STATES PATENTS

| | | | |
|---|---|---|---|
| 2,749,488 | 6/1956 | Mayer | 357/74 |
| 2,751,527 | 6/1956 | Shower | 357/74 |
| 3,238,427 | 3/1966 | Rose | 357/74 |
| 3,303,432 | 2/1967 | Garfinkel et al. | 357/74 |
| 3,421,203 | 1/1969 | Ullman et al. | 357/74 |
| 3,553,499 | 1/1971 | Maguire | 357/74 |
| 3,560,275 | 2/1971 | Kressel | 357/74 |
| 3,739,241 | 6/1973 | Thillays | 357/74 |
| 3,842,262 | 10/1974 | Heitman | 357/74 |

*Primary Examiner*—Andrew J. James
*Attorney, Agent, or Firm*—Nathan Edelberg; Robert P. Gibson; Max L. Harwell

[57] ABSTRACT

A low impedance laser diode mounting structure in which the inductive reactance and the capacitive reactance are balanced to leave only the pure resistance in the input to a diode. The low impedance laser diode mounting structure comprises a large diameter, conductive central electrode of one potential separated from a conductive housing of the opposite potential by a layer of insulation, such as glass frit. The width of the insulation layer is such that the capacitive reactance caused by the capacitance included between the input electrode, which is generally of positive potential, and the housing, which is usually at ground potential, is equal to the inductive reactance included in the short lead of the input electrode. The input electrode and housing may be made of copper, brass or other high conductivity metals.

One side of the diode is mounted on a heat sink that is electrically connected to the housing. A short lead, made of copper or gold, connects the input electrode to the other side of the diode.

5 Claims, 4 Drawing Figures

3,946,416

LOW IMPEDANCE DIODE MOUNTING STRUCTURE AND HOUSING

The invention described herein may be manufactured, used, and licensed by or for the Government for governmental purposes without the payment to me of any royalty thereon.

This is a continuation of application Ser. No. 354,067, filed Apr. 24, 1973 and now abandoned.

BACKGROUND AND SUMMARY OF THE INVENTION

With emphasis on smaller and smaller infrared light beam producing devices, efficiency of all the components involved is tantamount to proper operation of the device. When the laser diode mounting structure is made smaller, there is a greater disparity in the inductive and capacitive reactances with the capacitive reactance being decreased and the inductive reactance being increased. This disparity causes the impedance of the diode input circuit to be increased, thus requiring more input power to drive the diode.

The electronic pulsing circuitry used to pulse a light emitting diode, such as a laser diode, is now made smaller by using thick film and thin film technology. A need, therefore, exists for smaller diode mounting structures commensurate with the smaller pulsing circuitry for enclosure in a smaller canister containing the combined pulsing circuitry, diode, and diode mounting structure. The present devices allow the overall size of the mounting structure to be reduced and at the same time alleviate the problem of disparite reactances.

DETAILED DESCRIPTION OF THE PREFERRED EMBODIMENT

Figure 1:
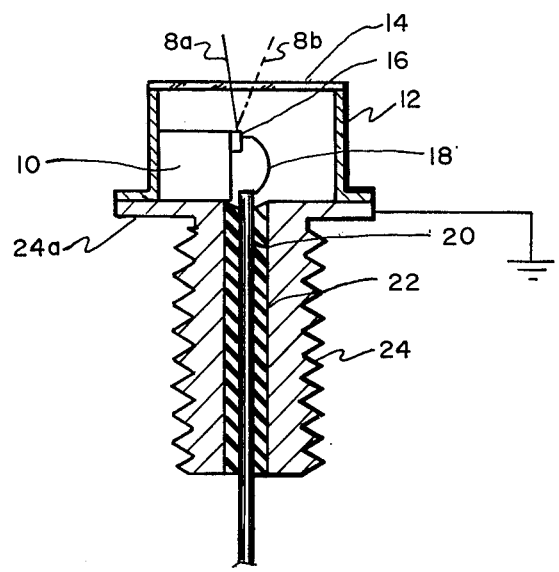
FIG. 1 shows a PRIOR ART diode mounting structure and housing.

FIG. 1 illustrates a diode mounting structure showing the small feed wire, or central electrode 20, that is typical of prior art diode input circuits. The overall structure is screw threaded on a power source canister by the threaded stem 24 which is usually at ground potential. The canister contains either a direct current power supply or a pulsing power source to which central electrode 20 is connected. The overall diode mounting structure and housing of this invention may be used as the diode structure 17 in a copending patent application entitled "Aiming Light and Aiming Light Adapter for Use on a Weapon" filed Apr. 24, 1973 having Ser. No. 354,034 by coinventors Howard L. Dunmire and the present inventor, Michael Hacskaylo, now U.S. Pat. No. 3,867,764.

The metallic threaded stem 24 is threaded into the power source canister (not shown) with stem 24 at ground potential. Central electrode 20 is in contact with the power source within the canister. Electrode 20 is of about 0.010 to 0.020 inches diameter. Stem 24 is threaded into the canister until flange 24a fits snugly against the canister. A diode cap 12 is in electrical contact with stem 24, heat sink 10, and the ground side of diode 16. The other side of diode 16 is connected to the power source by way of electrical lead 18 and central electrode 20. Electrical lead 18 is about 0.002 inch diameter and is usually made of gold. Diode 16 emits a light beam, indicated as 8a and 8b, out transparent window 14. The problem that existed in this prior art diode mounting structure is the high input impedance caused by the imbalance of capacitive and inductive reactances between central electrode 20 and stem 24 due to the thickness of the insulator layer 22 and the relative sizes of electrode 20 and stem 24.

Figure 2:
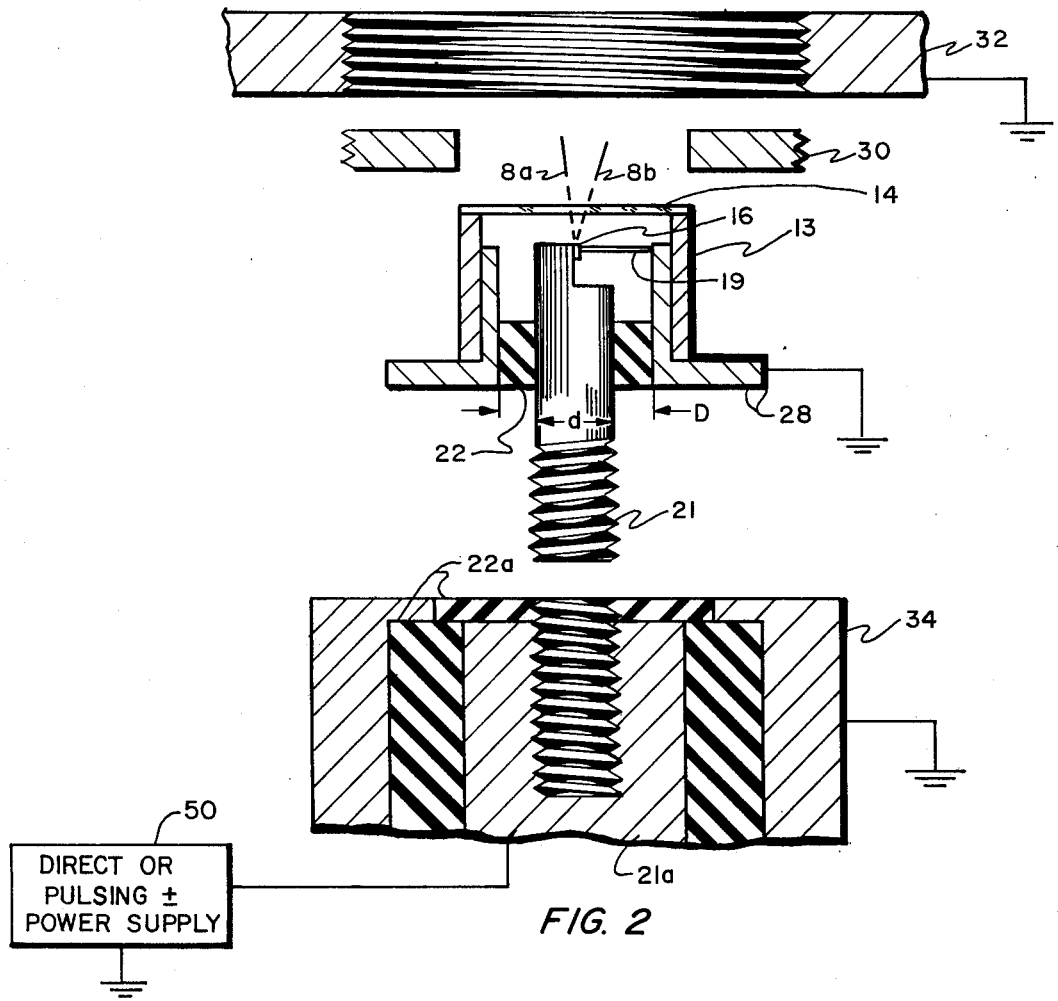
FIG. 2 illustrates one embodiment of an improved diode mounting structure and housing.

FIG. 2 illustrates one embodiment of an improved diode mounting structure and housing of the present invention shown juxtaposed to a canister 34 to which the structure and housing is adapted for threading thereto. Central electrode 21 is a solid metallic structure, made of copper or some good conductive metal, that is threaded to fit into the power source metallic section 21a within canister 34. The flange 28 and diode cap 13 are electrically connected together and meshed with the canister outer section 34 when the structure and housing are fully screw threaded into section 21a. Outer section 34 is at ground potential. Flange 28 and central electrode 21 are separated by insulator 22. Section 21a and outer section 34 are separated by insulator layer 22a. By making the diameter, $d$, of central electrode 21 larger when compared with the inside diameter, $D$, of flange 28, than the comparative diameters of central electrode 20 with the inside of stem 24 of the prior art, the capacitive reactance, $X_c$, of the input to diode 16 is decreased according to the following equation:

$$X_c = K \log_{10} \frac{D}{d}$$

Inductive reactance of the input circuit in the improved structure of FIG. 2 stays essentially the same as the prior art structure shown in FIG. 1. Central electrode 21 is about 0.125 inch diameter compared with 0.01 to 0.02 inch for electrode 20.

The diode mounting structure in FIG. 2 is also shown juxtaposed to portions of a casing, such as an aiming light housing as disclosed in the above referenced patent application entitled "Aiming Light and Aiming Light Adapter for Use on a Weapon," now U.S. Pat. No. 3,867,764. Specifically, 32 represents a terminal case, such as aiming light housing. Retainer ring 30 is slipped over diode cap 13 and fits up against flange 28. Diode cap 13 and retainer ring 30 are circular. Retainer ring 30 is screw threaded into terminal case 32. Case 32 and retainer ring 30 are made of electrical conductor material, and are at ground potential. Electrical lead 19 is about 0.004 inch in diameter.

Figure 3:
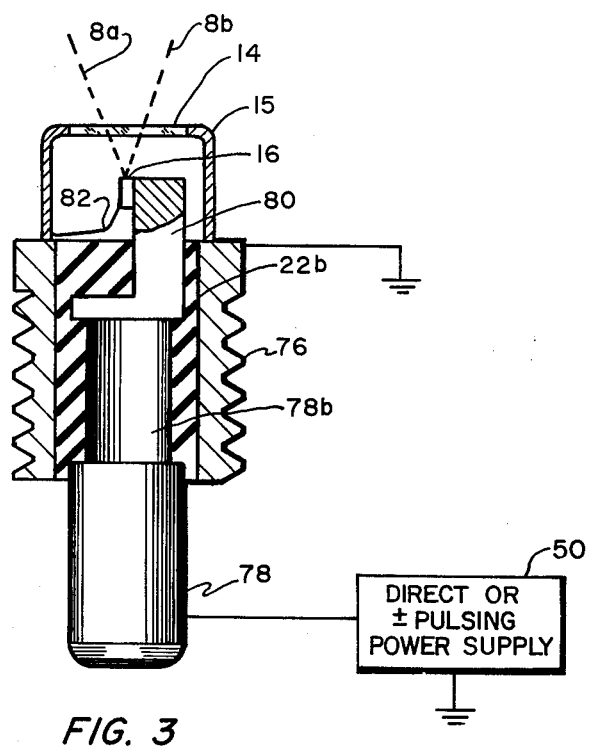
FIG. 3 illustrates a second embodiment of an improved diode mounting structure and housing.

FIG. 3 illustrates a second embodiment of a diode mounting structure in which a connecting pin 78 is inserted in a canister (not shown) and is screw threaded by conductive stem 76 to the canister. Stem 76 is generally grounded and pin 78 is connected to a power source that could be either positive or negative and direct current or pulsing, and indicated by black 50. A connector pin extension 78b that is smaller than pin 78 is connected between pin 78 and heat sink 80. An insulator 22b separates stem 76 from pin 78, pin extension 78b, and heat sink 80. A diode 16 is attached with its positive side to heat sink 80. An electrical lead 82 is soldered to diode cap 15 at one end and is soldered to the ground side of diode 16 at the other end. Diode 16 emits a light beam out transparent window 14 along the optical axis of the diode mounting structure with the light beams, represented by 8a and 8b, shown with an exaggerated beam spread.

Figure 4:
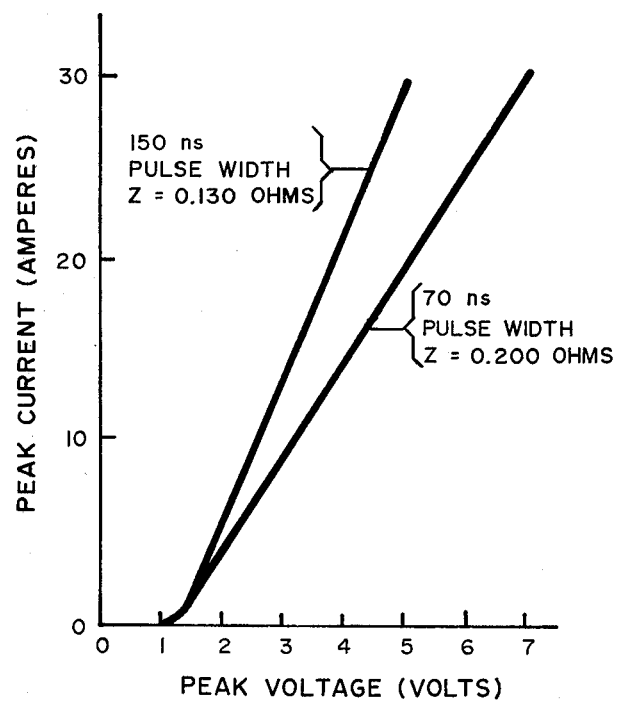
FIG. 4 shows the current-voltage characteristics of the diode used with the embodiment shown in FIG. 3.

FIG. 4 is a graph showing the current-voltage characteristics of the diode mounting structure illustrated in FIG. 3 when the diode is pulsed at 5 kilohertz at two different pulsewidths, namely 150 nanoseconds and 70 nanoseconds pulsewidths. The measured impedance at 150 nanoseconds pulsewidth is 0.13 ohms, and the measured impedance at 70 nanoseconds pulsewidth is 0.20 ohms. As can be seen by the graph, the current increases linearly with the applied pulsed voltages. The required driving voltage is about one fifth to one fourth what is required in the prior art housing structure shown in FIG. 1. For example, diode 16 is driven to a good operating current of 25 amperes peak current by about 5–6 volts pulses. The battery that drives the electronic circuitry power source in the canister has about 11.2 open circuit volts as stated in the above referenced copending patent application. Further, the electronic circuitry power source within the canister keeps the diode driving voltage up to the required 5–6 volts when the battery open circuit voltage drops almost in half. For proper diode 16 operation, the output power of the beam must be greater than 0.5 milliwatts.

The type diodes used with the mounting structure and housing of this invention are electron injection laser diodes of the gallium aluminum arsenide single heterojunction, close confinement structure, but are not necessarily limited to this type diode. These diodes are 0.006 inch by 0.012 inch having a threshold current of 11 amperes at room temperature. The beam spread of the light beams 8a and 8b from diode 16 is 25° at the one-tenth peak intensity points in the parallel plane of the diode junction, and is 32° at the one-tenth intensity points in the perpendicular plan of the diode junction.

By using the low impedance mounting structure and housing with highly efficient gallium aluminum arsenide laser diodes, a lightweight and compact semiconductor aiming light may be produced. The aiming light of patent application entitled "Aiming Light and Aiming Light Adapter for Use on a Weapon," now U.S. Pat. No. 3,867,764 is superior to the prior art non-coherent diode aiming light which is larger, heavier, and requires more driving power than the aiming light using the low impedance diode mounting structure of the present invention.

I claim:

1. A low input impedance mounting structure and housing for a high power laser diode driven at high frequency and short pulse widths at room temperature comprising:
    an electron injection high power laser diode of the gallium aluminum arsenide single heterojunction and close confinement structure, said high power laser diode having a first side and a second side;
    a high frequency and short pulse width power source;
    a large diameter highly conductive central electrode which is connected to said power source at one end and having said first side of the high power laser diode electrically connected to a heat sink at the other end thereof;
    a thin insulator layer contiguous with and surrounding said highly conductive central electrode;
    a conductive housing that is electrically grounded and is contiguous with said insulator layer, said conductive housing having a transparent window along the optical axis of said high power laser diode; and
    a short electrical lead connected between said conductive housing and said second side of the high power laser diode whereby said thin insulator layer is of such a size when compared with the large diameter highly conductive central electrode as to minimize the capacitive reactance and balance with the inductive reactance between said central electrode and said housing to provide minimum input impedance.

2. A low input impedance mounting structure and housing as set forth in claim 1 wherein said large diameter highly conductive central electrode is 0.125 inch in diameter and the inside diameter of said conductive housing is 0.25 inch and said short electrical lead is 0.004 inch diameter.

3. A low input impedance mounting structure and housing as set forth in claim 2 wherein said large diameter highly conductive central electrode, said conductive housing, and said short electrical lead are made of copper.

4. A low input impedance mounting structure and housing as set forth in claim 3 wherein said power source produces pulses to said high power laser diode at 5 kilo-Hertz frequency and 70 to 150 nanoseconds pulse widths.

5. A low input impedance mounting structure and housing as set forth in claim 4 wherein said insulator layer is glass frit.

* * * * *